United States Patent [19]

Focht et al.

[11] Patent Number: 4,599,791
[45] Date of Patent: Jul. 15, 1986

[54] METHOD OF MAKING INTEGRATED CIRCUITS EMPLOYING PROTON-BOMBARDED AlGaAs LAYERS

[75] Inventors: Marlin W. Focht, Stewartsville; Louis A. Koszi, Scotch Plains; Bertram Schwartz, Westfield, all of N.J.

[73] Assignee: AT&T Bell Laboratories, Murray Hill, N.J.

[21] Appl. No.: 555,670

[22] Filed: Nov. 28, 1983

[51] Int. Cl.$^4$ ............... H01L 21/76; H01L 21/263
[52] U.S. Cl. ................................. 29/576 B; 148/1.5; 148/175; 148/DIG. 84; 372/45; 372/46
[58] Field of Search ............... 148/1.5, 175; 29/576 B; 372/45, 46

[56] References Cited

U.S. PATENT DOCUMENTS

| | | | |
|---|---|---|---|
| 3,824,133 | 7/1974 | D'Asaro | 148/1.5 |
| 4,378,255 | 3/1983 | Holonyak, Jr. et al. | 148/1.5 |
| 4,394,180 | 7/1983 | Dearnaley | 148/1.5 |
| 4,403,397 | 9/1983 | Bottka et al. | 29/576 B |
| 4,447,905 | 5/1984 | Dixon et al. | 372/46 |

FOREIGN PATENT DOCUMENTS

| | | | |
|---|---|---|---|
| 0943336 | 2/1978 | Japan | 29/569 L |
| 0082281 | 7/1978 | Japan | 29/569 L |

OTHER PUBLICATIONS

"Compensation of N-Type GaAs by Proton Bombardment", *Second International Conference Ion Implantation in Semiconductors*, Springer-Verlag, Berlin, 1971, pp. 212-221, B. R. Pruniaux et al.

"Optical and Electrical Properties of Proton Bombarded P-Type GaAs", *J. Appl. Phys.*, vol. 44, No. 1, Jan. 1973, p. 207, J. C. Dyment et al.

"Deuteron Bombardment of Gallium Arsenide for Device Isolation", *IEEE Electron Dev. Lett.*, vol. EDL-1, No. 5, p. 72 (1980), K. Steeples et al.

"Proton Bombardment in InP", *Solid-State Electronics*, vol. 20, (1977), pp. 727-730, J. P. Donnelly et al.

"The Electrical Characteristics of Ion Implanted Compound Semiconductors", *Nuclear Instruments and Methods*, (1981) pp. 553-571, J. P. Donnelly et al.

"High Resistivity in P-Type InP by Deuteron Bombardment", *Appl. Phys. Lett.*, vol. 42, No. 11, (Jun. 1, 1983) pp. 970-972, M. W. Focht et al.

"Annealing of Defects in Ion-Bombarded Indium Antimonide", *Sov. Phys. Semicond.*, vol. 11, No. 7, (Jul. 1977) pp. 798-800, V. A. Bogatyrev et al.

"Electrical Properties of Proton and Helium Ion Bombarded GaAs", *Report on Research Applications*, 24(2) (1975), H. Harada et al.

*Primary Examiner*—Upendra Roy
*Attorney, Agent, or Firm*—Michael J. Urbano

[57] ABSTRACT

The property of materials in the GaAs/AlGaAs system, whereby at certain doses proton bombarded n-type material becomes highly resistive but p-type material remains highly conductive, is utilized to fabrication of integrated circuits which include buried semiconductor interconnections or bus bars between devices.

6 Claims, 4 Drawing Figures

METHOD OF MAKING INTEGRATED CIRCUITS EMPLOYING PROTON-BOMBARDED AlGaAs LAYERS

CROSS REFERENCES TO RELATED APPLICATIONS

This application was concurrently filed with the following applications: P. J. Anthony, R. L. Hartman, L. A. Koszi and B. Schwartz, Ser. No. 555,506 (now U.S. Pat. No. 4,539,743 issued on Sept. 10, 1985) entitled "The Production of Semiconductor Devices With Buried Resistive Regions by Controlled Ion Bombardment and Heat Treatment," and F. Capasso, M. W. Focht, A. T. Macrander and B. Schwartz Ser. No. 555,671 entitled "Integrated Circutis Employing Ion-Bombarded InP Layers."

BACKGROUND OF THE INVENTION

This invention relates to a technique for fabricating GaAs/AlGaAs semiconductor structures having juxtaposed high and low resistivity regions and, more particularly, to integrated circuits in which buried interconnections are realized using such structures.

Integrated circuits typically include a plurality of devices (e.g., components or circuits) formed in a single semiconductor wafer. The devices may be electrically isolated from one another by a variety of techniques: p-n junction isolation, etched-groove isolation, or oxide channel isolation, for example. Metallization patterns on the surface of the wafer are used to address selected devices or to interconnect them to one another. Generally speaking, however, the interconnection and/or addressing of devices does not involve buried semiconductor channels to achieve these functions.

SUMMARY OF THE INVENTION

In accordance with our invention, we advantageously exploit the property of materials in the $Al_xGa_{1-x}As$ ($0 \leq x \leq 1$) system which, when subjected to proton bombardment, become highly resistive, but the peak resistivity of n-type material is nearly four orders of magnitude greater than that of p-type material and occurs at nearly two orders of magnitude lower proton dosage. In addition, at the dose where n-type material reaches its peak resistivity p-type material remains highly conductive. These characteristics allow buried semiconductor interconnections and buried semiconductor bus bars to be realized by building into an integrated circuit alternating n-type and p-type $Al_xGa_{1-x}As$ layers and utilizing different proton bombardment doses and energies to render selected n-type layers highly resistive while p-type layers remain highly conductive. The bombarded n-type layers can be used to electrically isolate devices from one another or to define the boundaries of p-type layers used as buried interconnections or bus bars.

BRIEF DESCRIPTION OF THE DRAWING

Our invention, together with its various features and advantages, can be readily understood from the following, more detailed description taken in conjunction with the accompanying drawing, in which.

DETAILED DESCRIPTION

Figure 1:
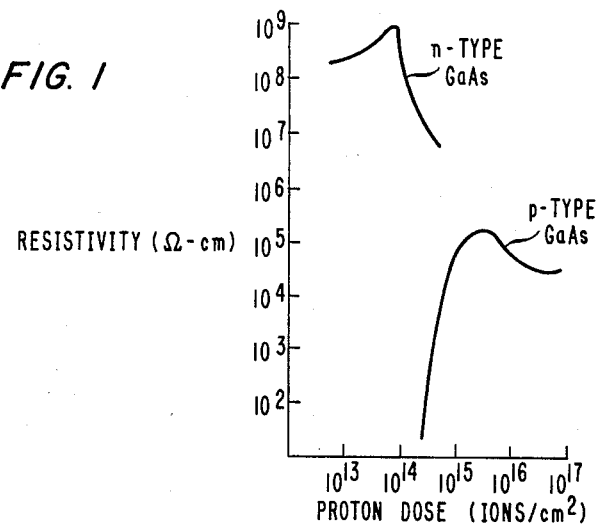
FIG. 1 is a graph of resistivity versus proton dose for n-type and p-type GaAs.

With reference now to FIG. 1, there is shown a graph of resistivity versus proton bombardment dose for n-type GaAs and p-type GaAs. See B. R. Pruniaux et al, *Second International Conference, Ion Implanatation in Semiconductors*, Springer-Verlag, Berlin, 1971, p. 212, and J. C. Dyment et al, *Journal of Applied Physics*, Vol. 44, p. 207 (1973). Several characteristics of proton bombarded GaAs are advantageously exploited in accordance with out invention. First, the peak resistivity for n-type GaAs is approximately $10^9$ ohm-cm, whereas the peak resistivity for p-type GaAs is approximately $10^5$ ohms-cm, nearly four orders of magnitude lower. Second, the peak resistivity for n-type GaAs occurs at a dose of approximately $1 \times 10^{14}/cm^2$, whereas the peak resistivity for p-type GaAs occurs at a dose of about $5 \times 10^{15}/cm^2$. Third, at a dose of $1 \times 10^{14}/cm^2$ p-type GaAs remains highly conductive while n-type GaAs becomes highly resistive. As a consequence, in a multi-layered structure containing both n-type and p-type layers, appropriate choice of the proton dose enables selected n-type GaAs layers to become highly resistive, whereas p-type GaAs layers remain highly conductive. Further selectivity can be attained by appropriate choice of the energy of the protons which typically penetrate into GaAs to a depth of approximately 1 $\mu$m for each 100 keV, for example. That is, a proton energy of 300 keV produces an approximately Gaussian distribution of protons in the semiconductor with the peak of the distribution occurring at a depth of approximately 3 $\mu$m into the bombarded material. Similarly, proton bombardment at 200 keV would produce a corresponding peak at a depth of about 2 $\mu$m. Accordingly, multiple bombardments at different energies can be performed sequentially in order to produce a more nearly uniform distribution of resistivity.

The general profiles shown in FIG. 1 are applicable to other Group III-V compounds containing GaAs (e.g., $Al_xGa_{1-x}As$, $0 \leq x \leq 1$) as well as to a variety of n-type dopants (e.g., Sn, Te), p-type dopants (e.g., Zn, Ge), and a range of dopant concentrations. But, in the latter instance, higher donor concentrations typically require a higher proton dose to attain the same resistivity level.

Figure 2:
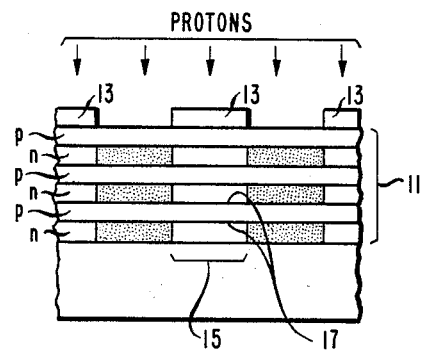
FIG. 2 is a schematic showing how a proton-bombarded, multi-layered structure results in selected n-type layers becoming highly resistive.

In accordance with our invention, therefore, a structure of the type shown in FIG. 2, which includes alternating layers 11 of n-type and p-type GaAs, is proton bombarded at an energy and dose so that the p-type GaAs layers remain highly conductive, whereas the n-type GaAs layers become highly resistive. Moreover, a patterned mask 13 may be used to form device channels 15, including p-n junctions 17, which are integrally connected to the highly conductive p-type layers. In this fashion, the p-type GaAs layers may be utilized as a buried semiconductor interconnections or buired semiconductors bus bars which connect separated devices of an integrated circuit.

Figure 3:
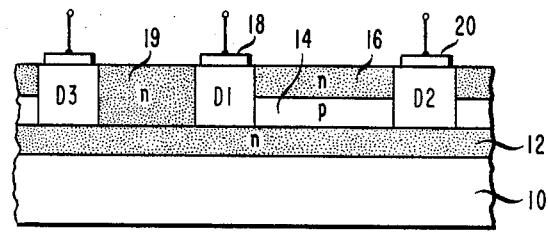
FIG. 3 is a schematic of an integrated circuit using a p-GaAs layer as a buried interconnection in accordance with one embodiment of our invention.

One embodiment of our invention utilizing a buried semiconductor interconnection is shown schematically in FIG. 3. This integrated circuit includes a substrate 10 on which is formed a hgihly resistive n-GaAs layer 12. A set of devices D1, D2 and D3 are formed on the layer 12 by any suitable fabrication technique well known in the art. The devices may be identical to one another (e.g., transistor memory cells) or they may be different from one another (e.g., a laser and an FET driver in an optical integrated circuit). The devices D1 and D3 are electrically isolated from one another by a high resistivity n-type layer 19 whereas D1 and D2 are electrically connected to one another via a highly conductive p-GaAs layer 14. A highly resistive n-GaAs layer 16 is formed on top of layer 14 and preferably is grown to a thickness which renders the top surface of the overall structure planar. Thus, the devices D1 and D2 are partially embedded in the semiconductor body formed by layers 12, 14 and 16, whereas D1 and D3 are partially embedded in the body formed by layers 12 and 19. Of course, these devices could be fully embedded depending on the particular application. The high resistivity of the n-GaAs layers 12 and 16 is effective to electrically isolate the devices D1 and D2 from one another except for the conductive path provided by the high conductivity layer 14. Electrical signals are communicated between the devices D1 and D2 through the layer 14 which, therefore, serves as a buried interconection. Contacts 18 and 20 on the top of devices D1 and D2, rspectively, permit interconnection to the outside world.

The portion of the structure of FIG. 3 associated with D1 and D2 may be fabricated in accordance with the following illustrative sequence of process steps. Using a well-known epitaxial growth technique (such as LPE, MBE or CVD), three epitaxial layers 12, 14, and 16 of n-GaAs, p-GaAs and n-GaAs, respectively, are grown on a single crystal substrate 10. Alternatively, these layers may be formed by localized ion implantation and/or diffusion. The three layers are then subjected to one or more proton bombardments at a dose in the range of approximately $10^{13}$–$10^{14}$/cm$^2$, thereby rendering the n-GaAs layers 12 and 16 highly resistive (e.g., $10^8$–$10^9$ ohm-cm) but leaving the p-GaAs layer 14 highly conductive. Depending upon the thickness of the layers 12, 14, and 16, it may be desirable to utilize multiple proton bombardments at different energies in order to render both layers 12 and 16, which are at different depths, highly resistive. Moreover, in the event that the device is so thick that layer 12 cannot be reached by protons at the highest energy available from the implantation machine, then it is possible to bombard layer 12 prior to growing layers 14 and 16. This procedure may not be preferred, however, because it complicates the processing sequence, and also because epitaxial growth on the bombarded surface of layer 12 may be difficult. Once the three layers have been proton bombarded so that layers 12 and 16 are highly resistive, the devices D1 and D2 are formed. The fabrication of these devices may entail standard processing techiques such as the etching of a channel through layers 14 and 16 and subsequent epitaxial regrowth of layers (not shown) which constitute each of the devices. Illustratively, the layers grown in such a channel would form suitable p-n junctions depending upon the specific device design. Alternatively, the devices D1 and D2 may be formed in layers 14 and 16 by suitable masking of the device regions from proton bombardment and subsequent diffusion or implantation of dopants therein. Of course, a combination of these techniques may also be used. Although each of the devices D1 and D2 is shown schematically as occupying the area of a rectangle, the precise geometry depends upon both the processing technique utilized and the device design. Thus, for example, the devices may be formed in V-grooves which can be etched in Group III-V compound semiconductors as is well known in the art. In a similar fashion, the portion of the structure associated with devices D1 and D3 may be fabricated.

Figure 4:
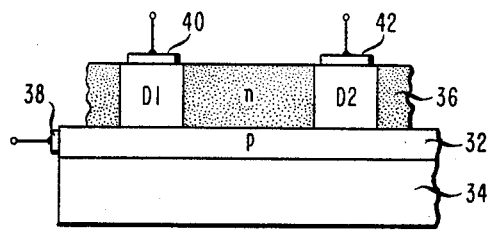
FIG. 4 is a schematic of an integrated circuit using a p-GaAs layer as a buried bus bar in accordance with another embodiment of our invention.

An alternative embodiment of our invention is depicted in FIG. 4 which demonstrates how a buried semiconductor bus bar may be utilized to interconnect the devices in an array (e.g., a semiconductor memory). A highly conductive p-GaAs layer 32 is epitaxially grown on a single crystal substrate 34 (e.g., on a semi-insulating Cr-doped GaAs substrate). A pair of devices D1 and D2 are formed on layer 32 and are isolated from one another by a highly resistive proton bombarded n-GaAs layer 36. Thus, devices D1 and D2 are once again at least partially embedded in the semiconductor body formed by layers 32 and 36, and the thicknesses of the devices and layer 36 are adapted to produce a planar structure. As in a semiconductor memory, device D1 would be selectively operated by applying a suitable electrical signal between contact 38 on layer 32, which serves as a bus bar, and contact 40 on the top of device D1. In a similar fashion, device D2 would be selectively operated by applying a signal between contact 38 and contact 42.

The structure of FIG. 4 may be fabricated by the following illustrative sequence of processing steps. Layes 32 and 36 are epitaxially grown on a semi-insulating single crystal substrate 34 of GaAs. The n-GaAs layer 36 is then subjected to one or more proton bombardments at a dose in the range $10^{13}$–$10^{14}$/cm$^2$, thereby rendering layer 36 highly resistive (e.g., $10^8$–$10^9$ ohms-cm). The energies of the bombardments are chosen so as to create high resistivity throughout the thickness of layer 36. Although layer 32 would not generally be proton bombarded, it is difficult to control precisely the maximum depth at which high resistivity will occur. That is, because of the Gaussian nature of the damage distribution produced by protons, it would be likely that the surface portion of p-GaAs layer 32 adjacent layer 36 would experience some proton bombardment. But because the proton dose is chosen to be less than approximately $10^{14}$/cm$^2$, only the n-type GaAs layer 36 will be rendered highly resistive. After the proton bombardment step is completed, the devices D1 and D2 are formed in layer 36 by any of the techniques described with reference to FIG. 3.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the structures of FIGS. 3 and 4 may involve different processing sequences such that the devices D1 and D2 are formed before the proton bombardment of layers 14 and 16 of FIG. 3 or the proton bombardment of layers 32 and 36 of FIG. 4. In such cases, it may be desirable to suitably mask the top surfaces of the devices D1 and D2 in the event that the proton bombardment might adversely affect the characteristics or performance of the devices.

What is claimed is:

1. A method of manufacturing a device comprising the steps of
   (a) providing a multi-layered structure containing n-type and p-type layers of AlGaAs, and
   (b) proton bombarding at least one of said n-type layers and one of said p-type layers at a dose and energy so that only said at least one n-type layer becomes highly resistive.

2. A method of claim 1 wherein said bombarding step (b) is performed at a proton dose of less than approximately $10^{14}/cm^2$.

3. The method of claim 1 including, between steps (a) and (b), the additional step of forming a patterned mask on a surface of said structure, and wherein said proton bombarding step (b) takes place through the openings of said mask.

4. A method of manufacturing an integrated circuit comprising the steps of
   (a) providing a multi-layered structure containing layers of n-type and p-type AlGaAs,
   (b) proton bombarding at least one of said n-type layers and one of said p-type layers at a dose and energy so that only said at least one n-type layer becomes highly resistive, and
   (c) forming at least two separated devices in said structure so that said highly resistive n-type layer electrically isolates said devices from one another and said at least one p-type layer forms a conductive path between said devices.

5. The method of claim 4 wherein
   step (a) includes providing a structure comprising a highly conductive p-type layer sandwiched between a pair of n-type layers,
   step (b) renders said pair of n-type layers highly resistive but leaves said p-type layer highly conductive, and
   step (c) at least partially embeds said devices in said layers so that said pair of n-type layers bound said p-type layer which forms said conductive path between said devices.

6. The method of claim 4 wherein said devices are at least partially embedded in said at least one n-type layer and are formed upon said at least one p-type layer which forms a buried bus bar connecting said devices to one another.

* * * * *